United States Patent [19]
Gonzalez

[11] Patent Number: 5,312,768
[45] Date of Patent: May 17, 1994

[54] INTEGRATED PROCESS FOR FABRICATING RAISED, SOURCE/DRAIN, SHORT-CHANNEL TRANSISTORS

[75] Inventor: Fernando Gonzalez, Boise, Id.

[73] Assignee: Micron Technology, Inc., Boise, Id.

[21] Appl. No.: 28,311

[22] Filed: Mar. 9, 1993

[51] Int. Cl.$^5$ .......................................... H01L 21/265
[52] U.S. Cl. ........................................ 437/40; 437/41; 437/34
[58] Field of Search ............... 437/52, 60, 919, 41, 437/44, 40, 34

[56] References Cited

U.S. PATENT DOCUMENTS

| | | |
|---|---|---|
| 5,057,447 | 10/1991 | Paterson ................................ 437/60 |
| 5,153,145 | 10/1992 | Lee et al. ............................... 437/44 |
| 5,168,073 | 12/1992 | Gonzalez et al. ...................... 437/47 |

OTHER PUBLICATIONS

Tasch, A. F.; H. Shin; and C. M. Maziar, *New Submicron MOSFET Structural Concept For Suppression Of Hot Carriers*, Electronics Letters, Jan. 4th, 1990, vol. 26, No. 1, pp. 39–41.

*Primary Examiner*—Olik Chaudhuri
*Assistant Examiner*—H. Jey Tsai
*Attorney, Agent, or Firm*—Hopkins, French, Crockett, Springer & Hoopes

[57] ABSTRACT

Processes for fabrication of: an N-channel raised source/drain MOSFET transistor; an N-channel and P-channel raised source/drain MOSFET device; and an N-channel raised source/drain MOSFET in conjunction with a DRAM memory cell capacitor. The process deposits a layer of titanium nitride over the N-channel and P-channel source/drain areas which acts as a barrier to phosphorus or boron atom outdiffusion so that the junction doping levels remain low in the source/drain areas, and N-channel and P-channel junctions will be shallow. The titanium nitride layer will serve as a dopant atom barrier in a capacitor storage node, an N-channel source/drain area, and a P-channel source/drain area.

9 Claims, 9 Drawing Sheets

INTEGRATED PROCESS FOR FABRICATING RAISED, SOURCE/DRAIN, SHORT-CHANNEL TRANSISTORS

FIELD OF THE INVENTION

This invention discloses a process for fabricating raised gate N-channel and P-channel MOSFET transistors singly or in conjunction with fabrication of each other or in conjunction with fabrication of a stacked DRAM capacitor.

BACKGROUND OF THE INVENTION

It is desirable in semiconductor construction to reduce the area and volume of devices on the chip, i.e., N-channel MOSFETS, P-channel MOSFETS, storage capacitors, etc. Methods to reduce size include providing narrower channel areas, narrower conducting metal lines, stacked components, etc. There are certain problems that occur in downsizing, i.e., short channel characteristics where there is a subthreshold $V_t$ current leakage or shifting of $V_t$ with age, higher contact resistances, "hot electron" problems, ion diffusion in the FET channel area, additional masking steps, etc.

Raised source/drains are not new art since there are methods of forming the raised source/drain by selective epitaxial growth, over the source/drain areas, of silicon or polysilicon. This more expensive process also can create phosphorous ion diffusion problems in the channel areas under the transistor gate. It is the purpose of this invention to offer the following advantages:

- eliminate a high-current source/drain ion implant step following formation of an oxide spacer;
- improve an N-channel MOSFET transistor subthreshold current characteristic;
- avoid the need for additional source/drain definition masking steps, such as N- and P-implants;
- reduce the outdiffusion of phosphorous ions in the channel area;
- reduce the source and drain junction contact resistance; and
- provide a simpler raised source/drain process that can be integrated with a capacitor or P-channel fabrication process.

SUMMARY OF THE INVENTION

There are four embodiments to the invention: a process for fabricating a raised source/drain N-channel MOSFET; a process for combining the N-channel process with fabrication of a P-channel MOSFET device; and a process for combining the N-channel fabrication with a capacitor memory cell formation and a process for combining all three devices.

The N-channel MOSFET process for a partially completed gate structure and silicon nitride barrier and oxide spacer over a substrate and adjacent a field oxide comprises:

- growing a second field oxide layer over the source and drain areas;
- selectively etching the silicon nitride barrier spacers, thereby exposing a narrow source and drain area between the oxide spacer and the second field oxide layer;
- depositing a titanium nitride layer over the MOSFET device;
- depositing a polysilicon layer over the titanium nitride layer;
- and simultaneously doping the polysilicon layer to create a conducting polysilicon layer, wherein the titanium nitride layer acts as a barrier to ion migration to the source and drain areas;
- etching the polysilicon layer to form an opening over the gate structure and a boundary over the field oxide layer wherein the titanium nitride acts as an etch barrier;
- etching the titanium nitride layer to form openings over the gate structure and a boundary over the field oxide layer thereby forming a raised source/drain electrical connection;
- depositing an oxide isolation layer over the MOSFET device;
- patterning a pair of contact openings in the oxide isolation layer over the conducting polysilicon wherein the titanium nitride acts as an etch barrier;
- depositing a thin titanium nitride layer within the contact openings;
- depositing and patterning a metal conductor within the contact opening; and then
- depositing and patterning a pair of bit line metal conductors over the metal conductor in the contact opening thereby providing a low-resistance electrical connection from the bit line through the raised source/drain electrical connection to the narrow source and drain areas.

The second embodiment, a process of forming both an N-channel and P-channel MOSFET device on a substrate comprises:

- depositing sequentially over the semiconductor substrate, a thin gate oxide layer, a polysilicon layer, a refractory metal silicide layer, and a top layer oxide;
- patterning a gate structure over an N-channel area;
- implanting ions in a source and drain area adjacent the N-channel gate structure;
- patterning a barrier spacer on opposite sides of the N-channel gate structure;
- growing a field oxide adjacent the N-channel gate structure over the substrate wherein the field oxide is bounded by the barrier spacer;
- etching to selectively remove the barrier spacer thereby exposing the source and drain areas;
- depositing a photoresist layer over the N-channel and P-channel devises;
- patterning a P-channel gate structure while protecting the N-channel device with the photoresist layer;
- ion implanting a low-dose P-channel source and drain area;
- forming an oxide spacer on opposite sides of the N-channel and P-channel gate structures;
- depositing a titanium nitride layer over the N-channel and P-channel devices;
- depositing a polysilicon layer over the N-channel and P-channel devises;
- in situ doping the polysilicon layer to create a conducting polysilicon layer;
- selectively etching the conducting polysilicon layer over the N-channel and P-channel devices to form an opening over the N-channel and P-channel gate structures and a boundary over the field oxide layer of the N-channel and P-channel devices;
- selectively etching the titanium nitride layer to form openings over the N-channel and P-channel gate structures and a boundary over the field oxide layers thereby forming a raised source/drain electrical connection at the N-channel and P-channel devices;

depositing an oxide isolation layer over the MOSFET device;

patterning a plurality of contact openings in the oxide isolation layer over the conducting polysilicon of the N-channel and P-channel devices;

depositing a thin titanium nitride layer within the contact openings;

depositing and patterning a tungsten conductor within the plurality contact openings; and then depositing and patterning a plurality of bit line metal conductors over the metal conductor in the contact opening thereby providing a low-resistance electrical connection from the bit line through the raised source/drain electrical connection to the source and drain areas of both N-channel and P-channel devices.

The third embodiment is an integrated process for forming a pair of DRAM memory cell access MOSFET transistors and a pair of memory cell capacitors, the transistors having a pair of gate structures over a substrate, a doped source and drain areas adjacent the gate structures, and a pair of field oxide areas above the substrate adjacent the source and drain areas, the process comprising the steps of:

depositing a titanium nitride (TiN) layer by a CVD process over the transistors and the gate oxide areas;

depositing and in situ doping a polysilicon layer over the TiN layer, wherein the TiN layer acts as a barrier to dopant atoms;

simultaneously, patterning a pair of transistor raised source/drain electrical connections and a pair of capacitor storage node plates on the titanium nitride and polysilicon layers;

depositing a thin dielectric over the capacitor storage node plates;

depositing and patterning a pair of capacitor top plates over the dielectric and storage node plates;

depositing an oxide isolation layer;

patterning contact openings in the oxide isolation layer over the top capacitor plates;

depositing and patterning a connection to the capacitor top plates at the end of the arrays to a $$\frac{V_{cc}}{2}$$

potential;

depositing and patterning a metal bit line electrical conductor connecting the transistor source areas and the raised source/drain electrical connection thereby connecting the pair of N-channel MOSFET transistors to the pair of capacitor memory cells.

A fourth embodiment is an integrated process for forming a pair of DRAM memory cell access N-channel MOSFET transistors, a pair of memory cell capacitors, and a P-channel MOSFET transistor, the transistors having gate structures over a substrate, doped source and drain areas adjacent the gate structures, and field oxide areas above the substrate adjacent the source and drain areas, the process comprising the steps of:

depositing a titanium nitride (TiN) layer by a CVD process over the N-channel and P-channel transistors, and the gate oxide areas;

depositing and in situ doping a polysilicon layer over the TiN layer, wherein the TiN layer acts as a barrier to dopant atoms;

simultaneously patterning a raised source/drain electrical connection on each transistor and a pair of capacitor storage node plates on the titanium nitride and polysilicon layers;

depositing a thin dielectric over the capacitor storage node plates;

depositing and patterning a pair of capacitor top plates over the dielectric and storage node plates;

depositing an oxide isolation layer;

patterning contact openings in the oxide isolation layer over the top capacitor plates;

depositing and patterning a connection to the capacitor top plates at the end of an array to a $$\frac{V_{cc}}{2}$$

potential; and then depositing and patterning a metal bit line electric conductor connecting the transistor source areas to the bit line thereby forming a pair of N-channel MOSFET transistors and a pair of capacitor memory cells and a P-channel MOSFET transistor.

Other objects, advantages, and capabilities of the present invention will become more apparent as the description proceeds.

BRIEF DESCRIPTION OF THE DRAWINGS

The invention may be better understood and further advantages and uses thereof may become more readily apparent when considered in view of the following detailed description of the exemplary embodiments, taken with the accompanied drawings, in which.

DETAILED DESCRIPTION OF THE PREFERRED EMBODIMENTS

The four embodiments of the invention can generally be described as: a process for fabricating a short-channel, raised source/drain, N-channel MOSFET device; a process for fabricating the N-channel device in conjunction with fabrication of a P-channel MOSFET device; and a process for fabricating a pair of the above N-channel MOSFET devices in conjunction with fabrication of a pair of adjacent memory cell capacitors.

First Embodiment

Figure 1:
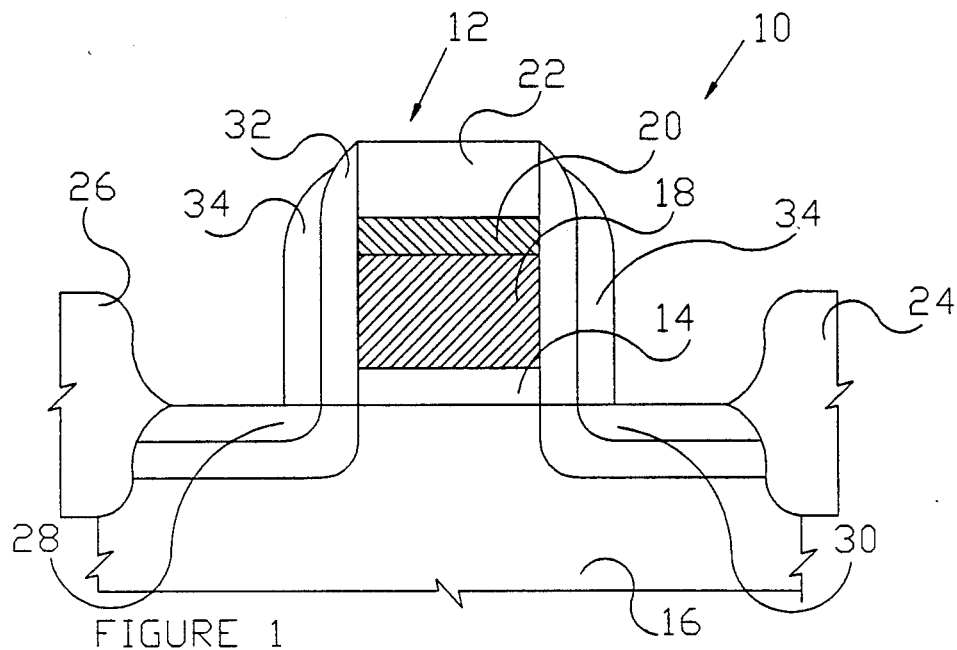
FIG. 1 is a section view of a partially completed N-channel transistor.

Referring to FIGS. 1-6, the sequential process for fabricating the short-channel, raised source/drain, N-channel MOSFET is disclosed. FIG. 1 illustrates in side section a partially completed N-channel MOSFET device, generally shown at 10. The gate structure at 12 has been fabricated with a gate oxide 14 above a P-well 16 on which a polysilicon gate 18, a conducting refractory metal silicide, such as tungsten silicide ($WSi_x$) layer 20, and an insulating oxide top layer 22. The gate structure 12 has been patterned between field oxide areas at 24 and 26. The source area 28 and drain area 30 have been doped by a boron punch-through protection implant process. A pair of oxide spacers 32 of about 1000-1500 Å have been patterned by depositing a conformal oxide layer which is then etched by a reactive ion etch (RIE) process followed by a phosphorous lightly-doped drain (LDD) N- implant. This thickness is chosen to be thick enough to reduce the effects of gate to source/drain capacitance and still small enough to maintain an overall compact cell. Finally, a pair of silicon nitride $Si_3N_4$ barrier spacers 34 are patterned adjacent the oxide spacers 32 and partially over the active source and drain areas 28 and 30. This silicon nitride spacer 34 will act as a barrier to oxide growth in the subsequent step of FIG. 2. The boron implant and phosphorus implant will out-diffuse enough to underlap the polysilicon gate 18.

Figure 2:
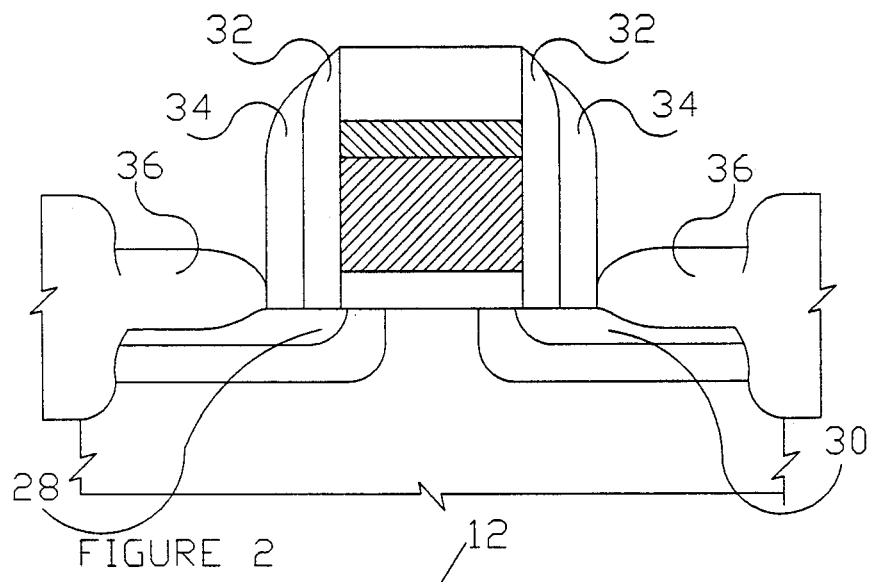
FIG. 2 is a section view of the N-channel transistor in a subsequent step of the inventive process.

FIG. 2 illustrates a subsequent step in MOSFET fabrication where an additional field oxide layer 36 has been grown over the source/drain areas 28 and 30.

Figure 3:
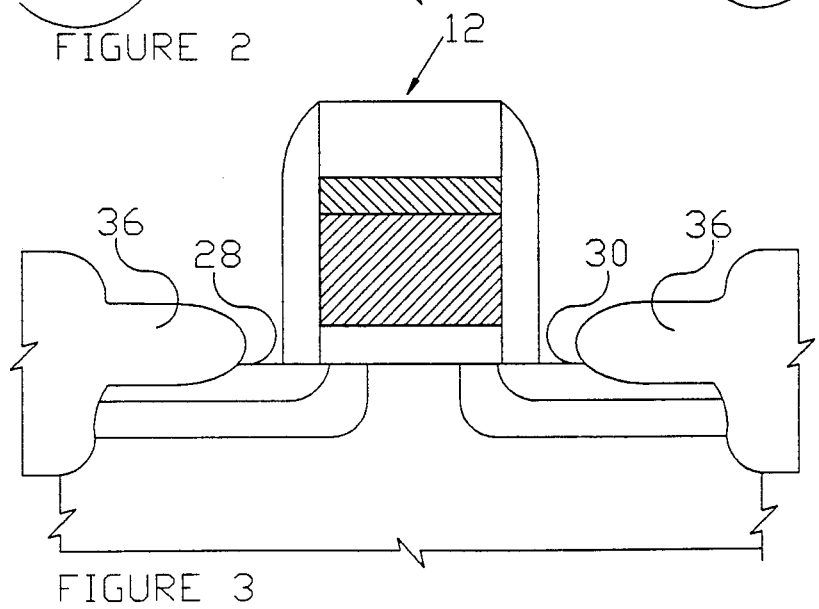
FIG. 3 is a section view of the N-channel transistor in a subsequent step of the inventive process.

In FIG. 3, the silicon nitride ($Si_3N_4$) spacer 34 has been removed typically by a hot phosphoric acid etch exposing the source/drain areas for subsequent raised source/drain connections, which are self-aligned to the polysilicon gate stack 12.

Figure 4:
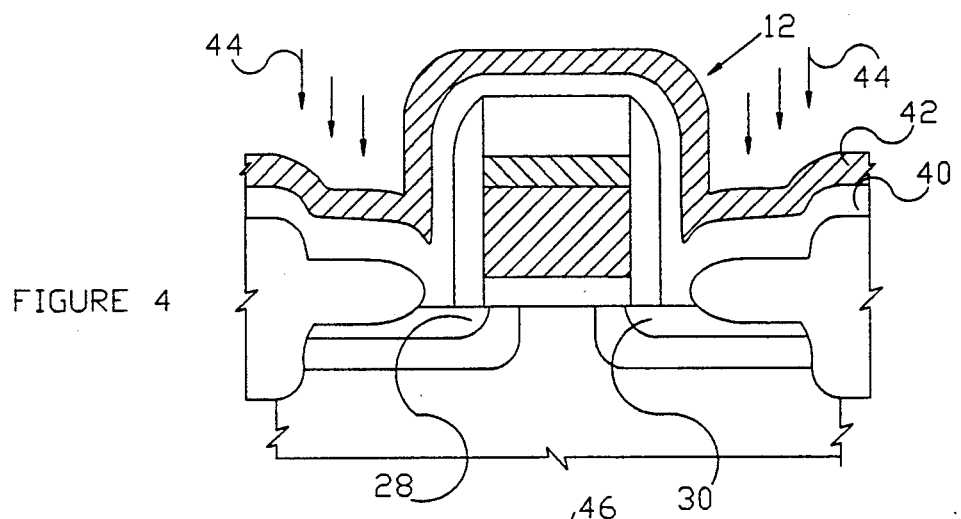
FIG. 4 is a section view of the N-channel transistor in a subsequent step of the inventive process.

FIG. 4 illustrates the deposition of a layer conductive titanium nitride (TiN) 40 by a chemical vapor deposition process, and a subsequent layer of polysilicon 42 by a low-temperature deposition. The conductive material 40 could also be selected from the group of transition metal nitrides, e.g., tungsten (W), molybdenum (Mo), tantalum (Ta), titanium (Ti), platinum (Pt), and cobalt (Co); but the preferred transition metal nitride is the titanium nitride (TiN). The polysilicon 42 is in situ doped during the low-temperature deposition, typically using arsenic or phosphorous as at 44, to create a conducting layer that conductively connects to the conductive titanium nitride 40. During doping, the titanium nitride layer 40 acts as a diffusion barrier to the active areas 28 and 30 by preventing migration of the N-type dopant ions to these active areas and under the N-channel gate 12. This migration will cause subthreshold voltage characteristic degradation and lower the threshold voltage $V_t$.

Figure 5:
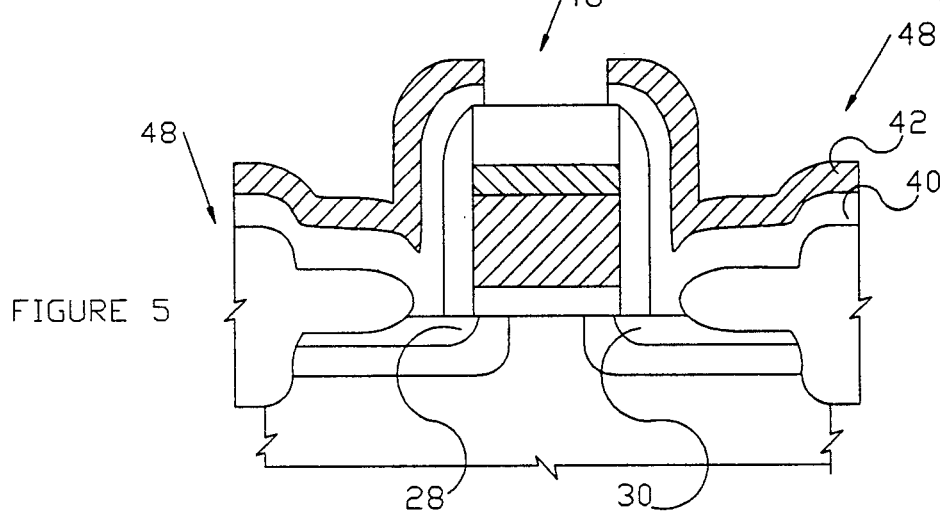
FIG. 5 is a section view of the N-channel transistor in a subsequent step of the inventive process.

Subsequent to layers 40 and 42 deposition in FIG. 5, the polysilicon layer 42 is patterned by a hydrofluoric and nitric acid etch where the TiN layer 40 acts as an etch stop. The TiN is then patterned by a wet etch using a solution of sulfuric acid and hydrogen peroxide, which does not etch the polysilicon. The etched layer opening is indicated at 46 and at boundary edges 48.

The process steps as indicated by FIGS. 4 and 5 can be performed in conjunction with fabrication of the bottom plate or storage node of an adjacent capacitor or in conjunction with fabrication of a peripheral device, i.e., P-channel MOSFET transistor, as will be described later. These steps of FIGS. 4 and 5 have provided a highly reliable, low transistor series resistance bonding to the source and drain areas 28 and 30.

Figure 6:
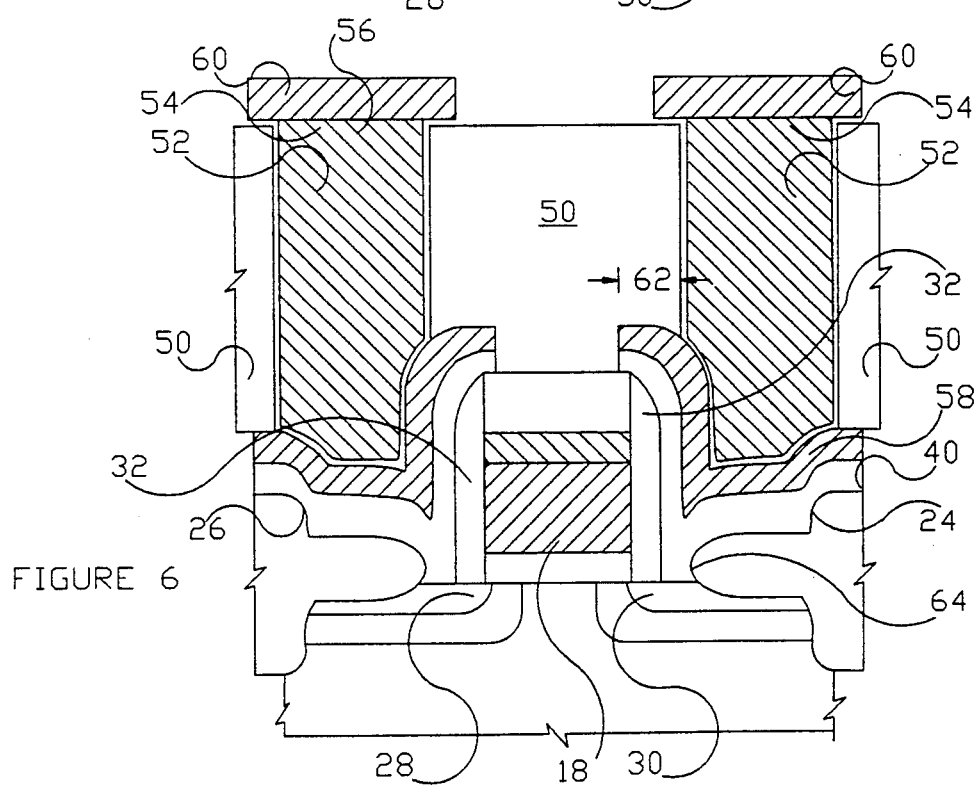
FIG. 6 is a section view of the N-channel transistor in a subsequent step of the inventive process.

Electrical connections to the source and drain areas 28 and 30 are completed as illustrated in FIG. 6. An oxide insulation layer 50 is deposited and patterned to form contact openings 52, in which a thin, conductive, TiN layer 54 is deposited. A conductor metal 56, such as tungsten, forms electrical contact with the polysilicon conductors at 58 which in turn are connected by the TiN layer 40 to the source and drain areas 28 and 30. A final bit line connecting metal layer 60 is patterned over the tungsten connection 56.

The resulting source/drain raised connection reduces the dimension between the contact hole to the transistor polysilicon gate (about 0.1 μm) indicated at 62. The TiN layer 40 on the edge of the polysilicon gate 18 and oxide spacer 32 acts as an oxide etch barrier to a contact oxide dry etch used in the contact opening 52 formation reducing the distance between the contact opening 52 and the polysilicon gate edge 18. Also, the TiN layer 40 allows the contact pattern 52 to overlap the field oxide 24 and 26 so that the field edge 64 can be closer to the polysilicon gate edge 66. This results in the potential for further device compaction or shrinkability.

Second Embodiment

Figure 7A:
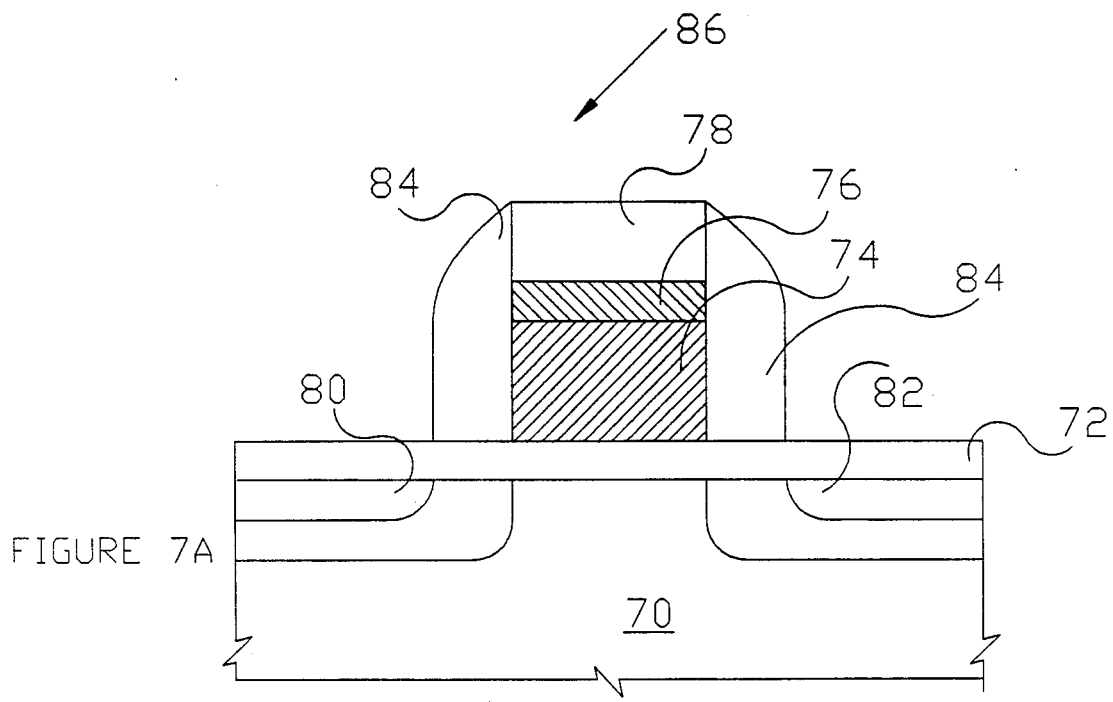
FIG. 7A is a section view of a partially completed N-channel transistor.
Figure 7B:
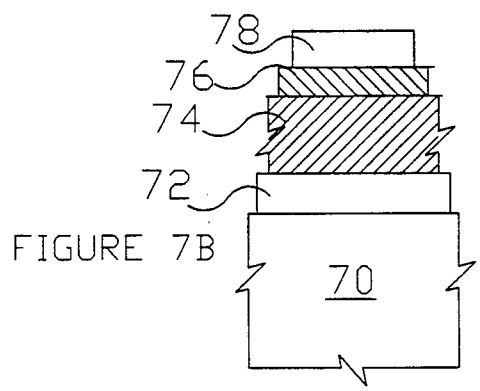
FIG. 7B is a section view of a partially completed P-channel transistor taken at the same time as FIG. 7A in the inventive process.

In the second embodiment, a process is disclosed for fabricating an N-channel MOSFET in conjunction with fabricating a P-channel MOSFET by ref erring to FIGS. 7A and 7B through 12A and 12B. The sequential structures f or the N-channel device are shown in FIGS. 7A, 8A, etc., while the P-channel sequential structures are shown in FIGS. 7B, 8B, etc. The N-channel device of FIG. 7A can be part of a DRAM memory, and the P-channel MOSFET of FIG. 7B could be a peripheral device not necessarily adjacent the N-channel MOSFET.

Figure 8A:
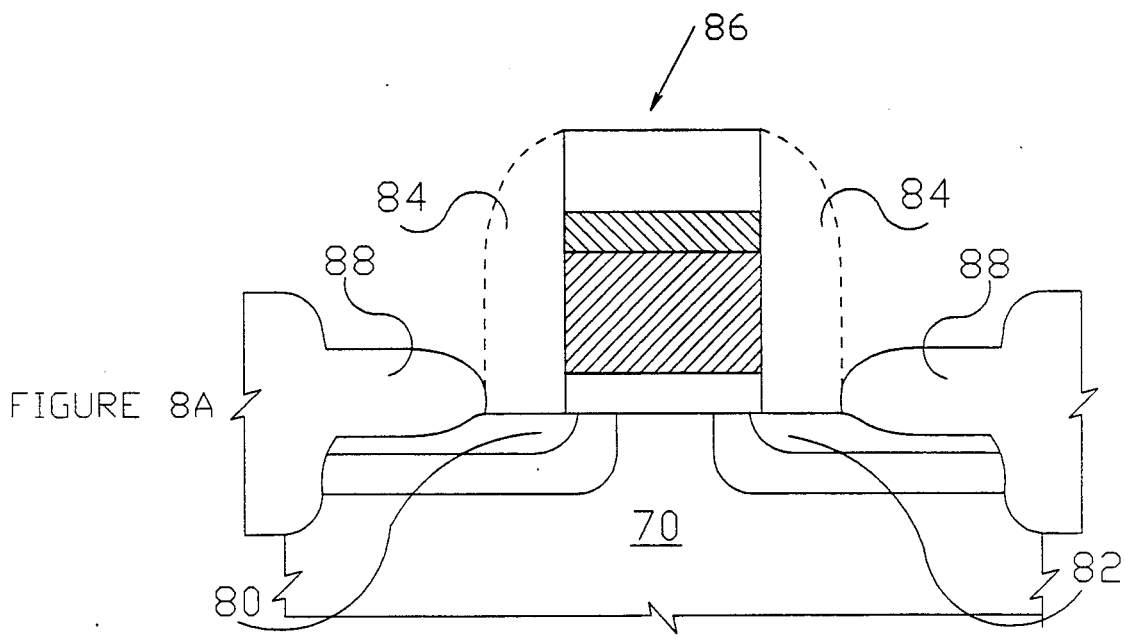
FIG. 8A is a section view of the N-channel transistor in a step subsequent to FIG. 7A.
Figure 8B:
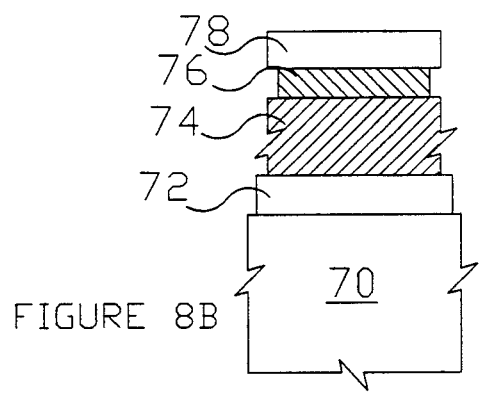
FIG. 8B is a section view of the P-channel transistor in a step subsequent to FIG. 7B.

In both FIGS. 7A and 7B, one can see the substrate 70 over which are layers of gate oxide 72, polysilicon 74, a silicide 76 and a gate top layer oxide 78. After patterning, the polysilicon gate 42, a boron punch-through protection implant is performed. In FIG. 7A, which is being patterned, the source area 80 and drain area 82 have been implanted by a phosphorous LDD N-ion implantation after a silicon nitride ($Si_3N_4$) barrier spacer 84 has been patterned on opposite sides of gate 86. At this time, the P-channel of FIG. 7B remains unpatterned. Next in the sequence, as shown in FIGS. 8A and 8B, is growth of the field oxide at 88 over active areas 80 and 82 which is bounded by the barrier spacer 84. Once the oxide growth is completed, the barrier 84 is removed by an etch process. During those steps, the P-channel areas remain unchanged, as in FIG. 8B.

Figure 9A:
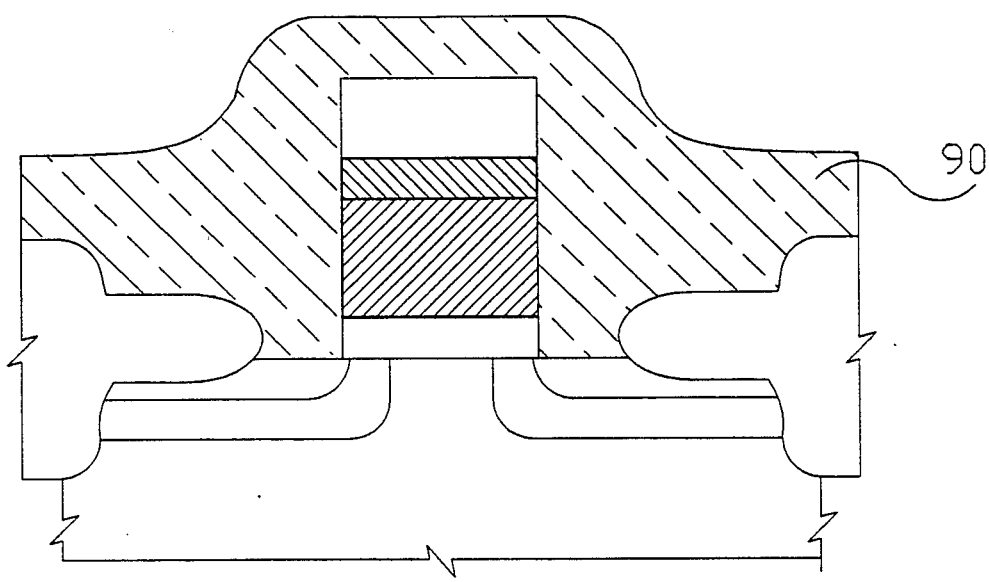
FIG. 9A is a section view of the N-channel transistor in a step subsequent to FIG. 8A.
Figure 9B:
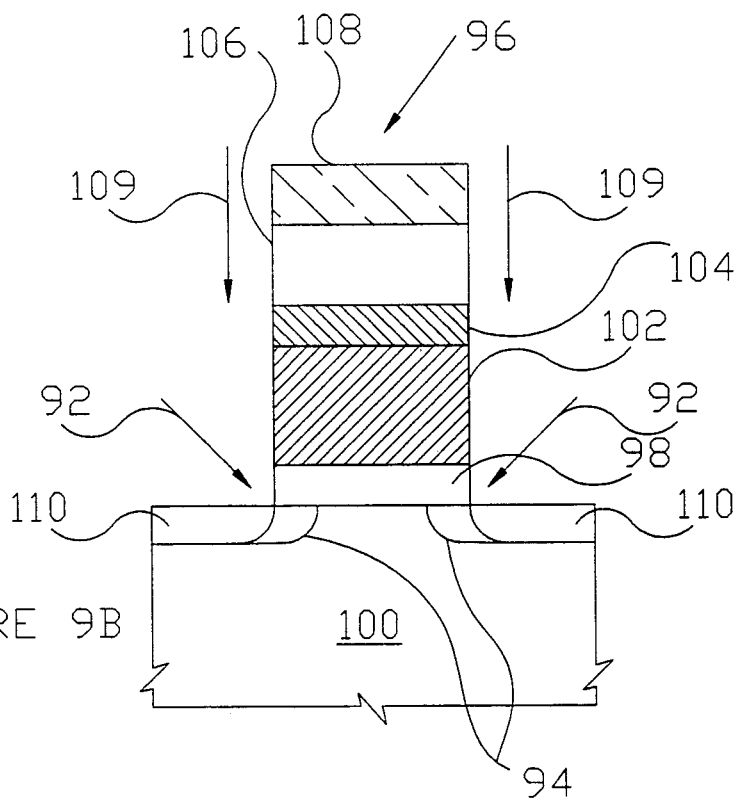
FIG. 9B is a section view of the P-channel transistor in a step subsequent to FIG. 8B.

In FIG. 9A, the N-channel patterning has temporarily ceased while the P-channel MOSFET has been patterned and an ion implant process is performed. The N-channel has been covered by a layer of photoresist 90, while in FIG. 9B two sets of ion implants are indicated. An angled phosphorous implant 92 creates a halo structure 94 adjacent and under the gate area 96 to provide punch-through protection for the channel area. The gate structure consisting of a gate oxide 98 on substrate 100 over which are the polysilicon 102, tungsten silicide 104,, top oxide layer 106, and the protecting photoresist 108 layer. An additional boron fluoride (BF$_2$) implant 109 creates P- source/drain areas 110 adjacent the halo structure 94.

Figure 10A:
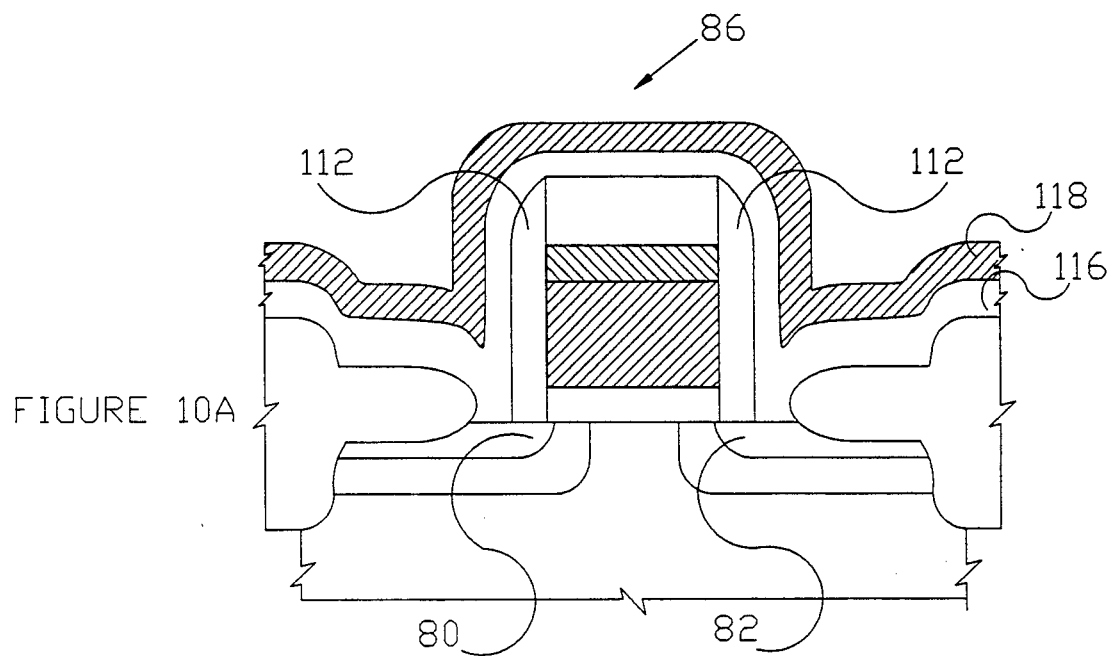
FIG. 10A is a section view of the N-channel transistor in a step subsequent to FIG. 9A.
Figure 10B:
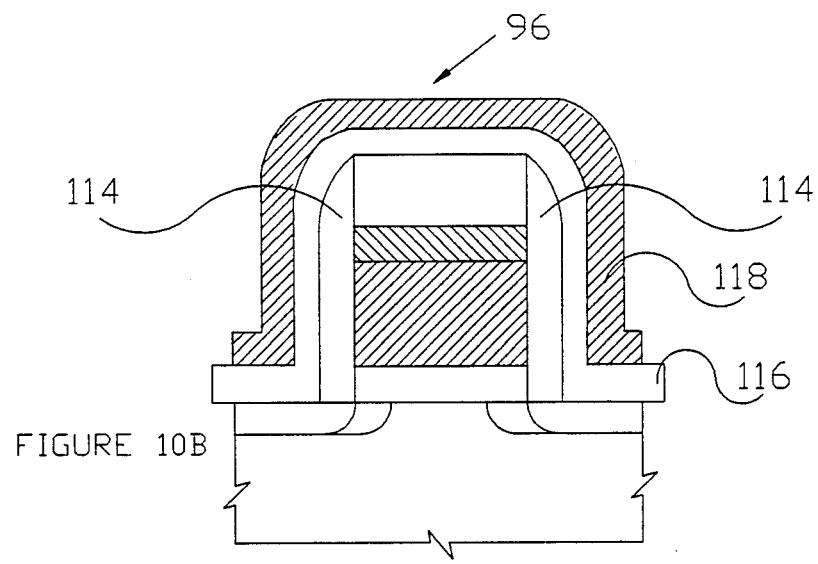
FIG. 10B is a section view of the P-channel transistor in a step subsequent to FIG. 9B.

At this point, parallel operations will continue on both the N-channel and P-channel MOSFETs as seen in FIGS. 10A and 10B. In both devices, oxide spacers 112 and 114 have been patterned adjacent the gate areas 86 and 96.

At this point, the thin conducting layer of titanium nitride 116 is deposited by CVD over both devices, followed by a layer of polysilicon 118 as seen in FIGS. 10A and 10B. Also, at the same time, the polysilicon layer 118 is in situ doped with phosphorus or arsenic to make it a conducting layer; and, again, as in the N-channel MOSFET description, the TiN layer acts as a barrier to the ion implant protecting the source/drain areas in both devices. In FIG. 10B, the TiN layer covers the P+ diode regions 110 and allows a connection between the N-type polysilicon 118 and the P+ diode 110 such that the resistance between the P+ diode 110 and the N-type polysilicon 118 is linear.

Figure 11A:
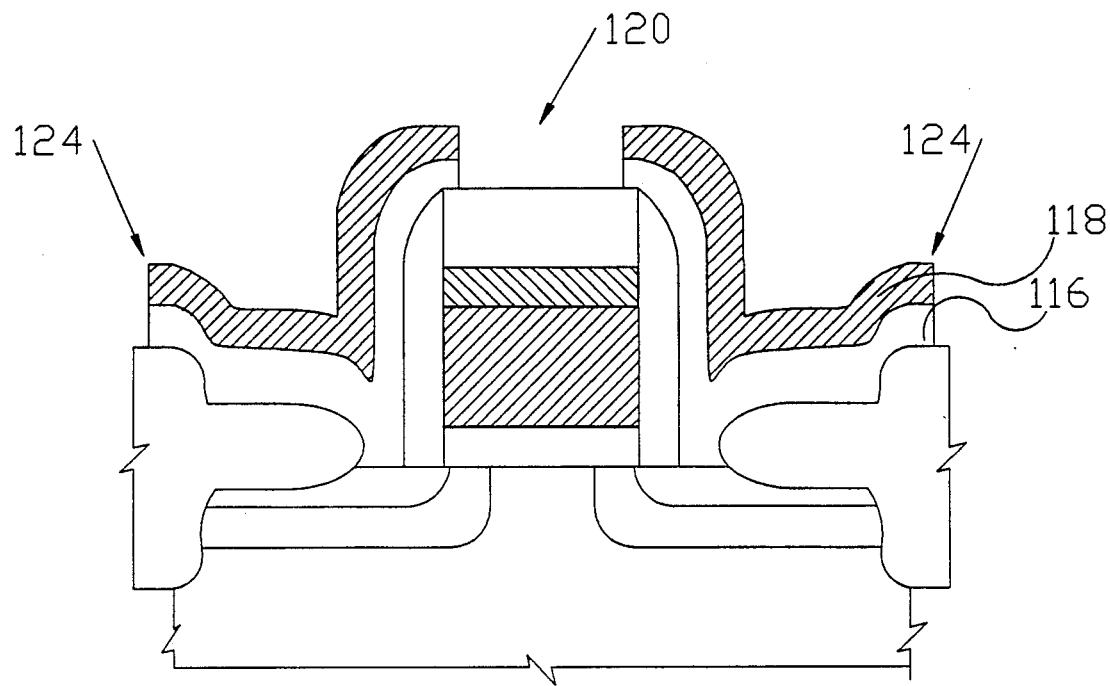
FIG. 11A is a section view of the N-channel transistor in a step subsequent to FIG. 10A.
Figure 11B:
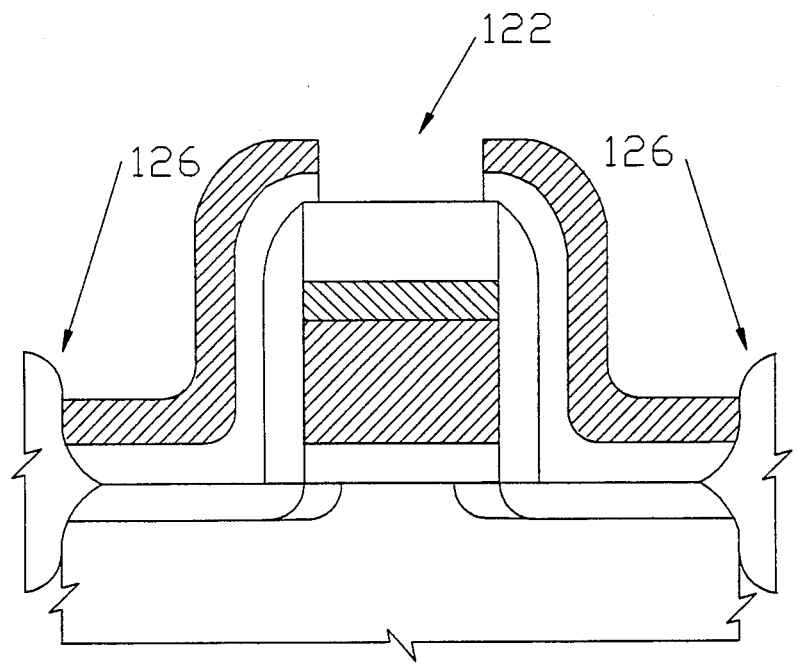
FIG. 11B is a section view of the P-channel transistor in a step subsequent to FIG. 10B.

The source/drain (S/D) conductors TiN layer 116 and doped polysilicon layer 118 are then etched in FIGS. 11A and 11B, as before by hydrofluoric and nitric acid followed by the sulfuric acid and peroxide etch of the TiN layer 116, creating the source/drain conductor separations at 120 and 122 and the boundaries 124 and 126. An optional single dry etch step may be used here if patterning is on an active S/D area since the TiN acts as an etch stop for the polysilicon etch.

Figure 12A:
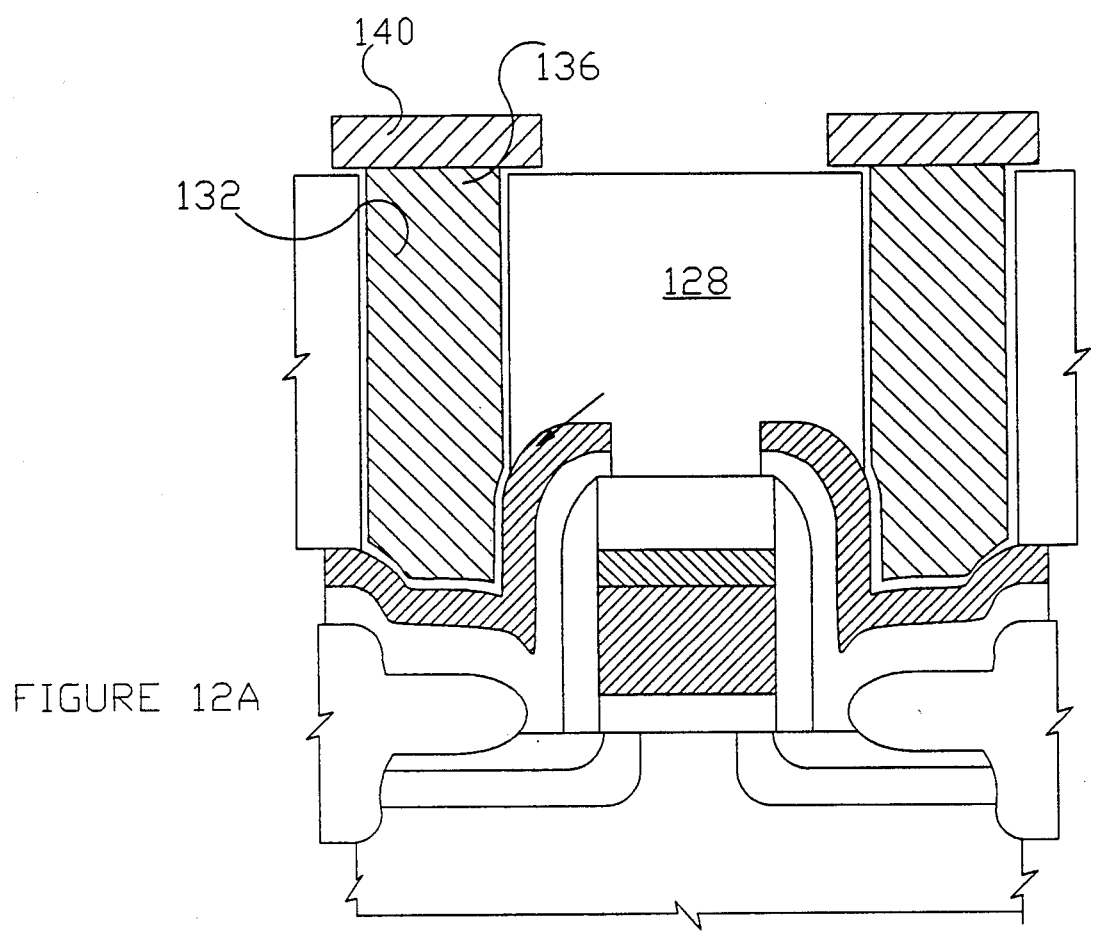
FIG. 12A is a section view of the N-channel transistor in a step subsequent to FIG. 11A.
Figure 12B:
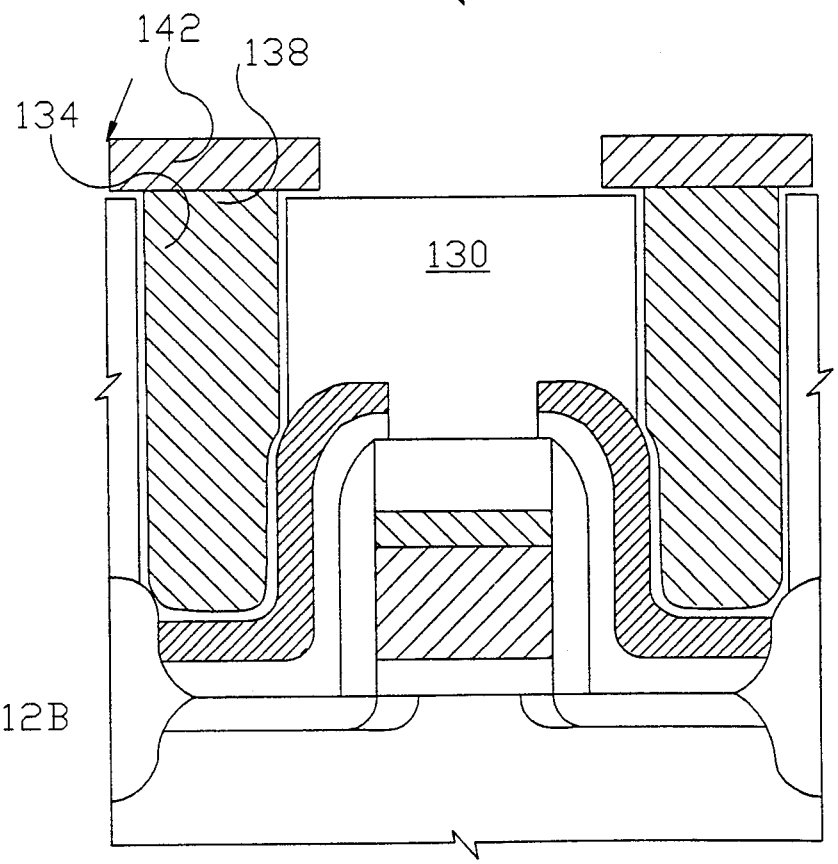
FIG. 12B is a section view of the P-channel transistor in a step subsequent to FIG. 11B.

The electrical connections to the raised source/drain areas are created in FIGS. 12A and 12B by patterning oxide isolation layers 128 and 130 to form the contact openings 132 and 134, which are then filled with metal contact (WSi$_x$) 136 and 138. Final bit line connections 140 and 142 are patterned over the tungsten (WSi$_x$) contacts to provide a conducting path from source and drain areas.

Third Embodiment

Figure 13:
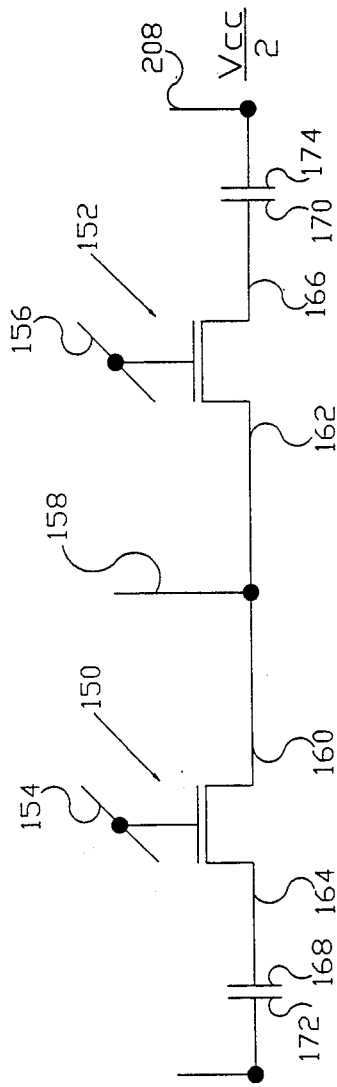
FIG. 13 is a schematic representation of a pair of memory cell capacitors and connecting MOSFET access transistors.

In a third embodiment, a process is disclosed for fabricating a pair of N-channel MOSFET access transistors in conjunction with fabrication of a pair of capacitors as part of a DRAM memory cell as schematically illustrated in FIG. 13. In this process, the MOSFET devices 150 and 152 each having wordlines 154 and 156 share a common bit line 158. The sources 160 and 162 are connected to the common bit line 158 and the drains 164 and 166 are connected to capacitor storage node plates 168 and 170. The top plates of the capacitors 172 and 174 would be typically connected to a voltage source $$\frac{Vcc}{2}.$$

A very thin dielectric layer at 176 and 178 (FIG. 14) separates the storage node plates 168 and 170 from top plates. A good dielectric would be silicon nitride (Si$_3$N$_4$) deposited and oxidized to form an ONO layer.

The fabrication process for this DRAM access transistors 150 and 152 would be similar to the N-channel transistor structure as described above and illustrates in FIGS. 1, 2, and 3. The structure of FIG. 14, similar to FIG. 3, would consist of: gate structures 180 and 182 above substrate P-well 184; doped source areas 160 and 162; doped drain areas 164 and 166; and field oxide areas at 186 and 188. At this point, the continuing process would comprise the steps of:

depositing a titanium nitride (TiN) layer 190 by a CVD process over the transistors 150 and 152 and the field oxide areas 186 and 188;

depositing and in situ doping a polysilicon layer 192 over the TiN layer 190, wherein the TiN layer 190 acts as a barrier to dopant atoms;

simultaneously patterning transistor raised source/drain electrical connections 194, 196, 198, and 200 and capacitor storage node plates at 168 and 170 in the titanium nitride and polysilicon layers;

depositing a thin dielectric 176 and 178 over the capacitor storage node plates;

depositing and patterning a pair of capacitor top plates 172 and 174 over the dielectric and storage node plates 168 and 170;

depositing and patterning contact openings in an oxide isolation layer 204;

depositing and patterning a $$\frac{Vcc}{2}$$

voltage connection to the capacitor top plates 172 and 174; and then depositing and patterning a metal bit line electric conductor 158 connecting the transistor source areas 160 and 162 to the bit line via a metal conductor 206, thereby forming a pair of N-channel MOSFET transistors and a pair of capacitor memory cells in an integrated process.

Using the above process combines the raised source/drain electrical connection fabrication step with the capacitor storage node fabrication step.

Fourth Embodiment

Figure 14:
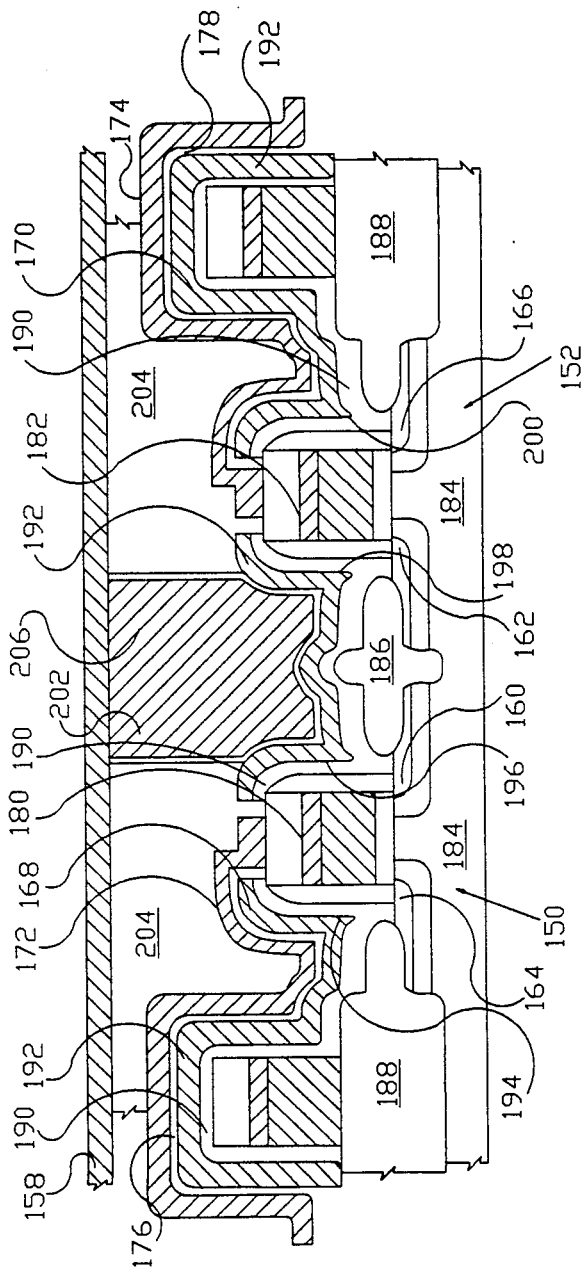
FIG. 14 is a section view of the capacitors and MOSFET transistors of FIG. 13 fabricated in accordance with the inventive process.

The fourth embodiment consists of combining embodiments two and three, i.e., simultaneously layering and patterning: the N-channel MOSFET titanium nitride layer (TiN) 116 and polysilicon layer 118 (FIG. 10A); the P-channel MOSFET layers 116 and 188; and, in parallel, the capacitor storage node layers of TiN 190 and polysilicon 192 (FIG. 14).

Referring to FIGS. 10, 12, 13, and 14, this integrated process for forming a pair of DRAM memory cell access N-channel MOSFET transistors, a pair of memory cell capacitors, and a P-channel MOSFET transistor, the transistors having gate structures over a substrate 86 and 96 (FIGS. 10A and 10B), doped source and drain areas 80, 82, and 110 adjacent the gate structures 86 and 96, and field oxide areas 88 (FIG. 8A) above the substrate adjacent the source and drain areas, comprises the steps of:

depositing a titanium nitride (TiN) layer 116 and 190 by a CVD process over the N-channel and P-channel transistors 86 and 96 (FIGS. 10A and 10B) and the field oxide areas 188 (FIG. 14);

depositing and in situ doping a polysilicon layer 118 and 192 (FIGS. 10A, 10B, and 14) over the TiN layer, wherein the TiN layer acts as a barrier to dopant atoms;

simultaneously patterning a raised source/drain electrical connection 136 and 138 (FIGS. 12A and 12B) on each transistor and a pair of capacitor storage node plates 168 and 170 (FIG. 14) on the titanium nitride 190 and polysilicon 192 layers;

depositing a thin dielectric 176 and 178 over the capacitor storage node plates 168 and 170;

depositing and patterning a pair of capacitor top plates 172 and 174 over the dielectric 176 and 178 and storage node 168 and 170 plates;

depositing oxide isolation layers 128, 130, and 204;

patterning contact openings in the oxide isolation layer over the top capacitor plates 172 and 174 (FIG. 14);

depositing and patterning a voltage connection 208 (FIG. 13) to the capacitor top plates 1; and then depositing and patterning a metal bit line electric conductor 206 connecting the transistor source areas 160 and 162 to a bit line 158 thereby forming a pair of N-channel MOSFET transistors, a pair of capacitor memory cells, and a P-channel MOSFET transistor.

While preferred embodiments of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. In a partially completed, N-channel MOSFET device having a gate structure, a pair of oxide spacers adjacent the gate structure, a pair of silicon nitride barrier spacers adjacent the oxide spacers, a doped source and drain area over a P-well in a substrate, and a field oxide layer adjacent the source and drain area, a process for completing fabrication of a raised source/drain N-channel MOSFET device comprising the steps of:

a. growing a second field oxide layer over the source and drain areas;

b. selectively etching the silicon nitride barrier spacers, thereby exposing a narrow source and drain area between the oxide spacer and the second field oxide layer;

c. depositing a transition metal nitride layer over the MOSFET device;

d. depositing a polysilicon layer over the metal nitride layer; and simultaneously e. in situ doping the polysilicon layer to create a conducting polysilicon layer, wherein the transition metal nitride layer acts as a barrier to ion migration to the source and drain areas;

f. etching the polysilicon layer to form an opening over the gate structure and a boundary over the field oxide layer wherein the metal nitride layer acts as an etch barrier;

g. etching the transition metal nitride layer to form openings over the gate structure and a boundary over the field oxide layer, thereby forming a raised source/drain electrical connection;

h. depositing an oxide isolation layer over the MOSFET device;

i. patterning and etching a pair of contact openings in the oxide isolation layer over the conducting polysilicon wherein the nitride layer acts as an etch barrier;

j. depositing a thin titanium nitride layer within the contact openings;

k. depositing and patterning a metal conductor within the contact opening; and then l. depositing and patterning a pair of bit line metal conductors over the metal conductor in the contact opening thereby providing a low-resistance electrical connection from the bit line through the raised source/drain electrical connection to the narrow source and drain areas.

2. The raised source/drain MOSFET fabrication process as recited in claim 1 wherein the transition metal is selected from the group consisting of tungsten, molybdenum, tantalum, titanium, platinum, and cobalt.

3. The raised source/drain MOSFET fabrication process as recited in claim 1 wherein the transition metal nitride is titanium nitride.

4. The raised source/drain MOSFET fabrication process as recited in claim 3 wherein the polysilicon layer is in situ doped with phosphorous or arsenic.

5. In a partially completed, N-channel MOSFET device having a gate structure, a pair of oxide spacers adjacent the gate structure, a pair of silicon nitride barrier spacers adjacent the oxide spacers, a doped source and drain area over a P-well in a substrate, and a field oxide layer adjacent the source and drain area, a process for completing fabrication of a raised source/drain N-channel MOSFET device comprising the steps of:

a. growing a second field oxide layer over the source and drain areas;

b. selectively etching the silicon nitride barrier spacers, thereby exposing a narrow source and drain area between the oxide spacer and the second field oxide layer;

c. depositing a titanium nitride layer over the MOSFET device;

d. depositing a polysilicon layer over the titanium nitride layer;

e. in situ doping the polysilicon layer with phosphorous or arsenic to create a conducting polysilicon layer, wherein the titanium nitride layer acts as a barrier to ion migration to the source and drain areas;

f. etching the polysilicon layer to form an opening over the gate structure and a boundary over the field oxide layer wherein the titanium nitride layer acts as an etch barrier;

g. etching the titanium nitride layer to form openings over the gate structure and a boundary over the field oxide layer, thereby forming a raised source/drain electrical connection;

h. depositing an oxide isolation layer over the MOSFET device;

i. patterning and etching a pair of contact openings in the oxide isolation layer over the conducting polysilicon;

j. depositing a thin titanium nitride layer within the contact openings;

k. depositing and patterning a tungsten conductor within the contact opening; and then l. depositing and patterning a pair of aluminum bit lines over the tungsten in the contact openings thereby providing a low-resistance electrical connection from the bit line through the raised source/drain electrical connection to the narrow source and drain areas wherein the distance between the pair of bit lines is greater than the distance between the narrow source/drain areas.

6. In a semiconductor device, an integrated process for fabrication of both an N-channel MOSFET device and a P-channel MOSFET device on a substrate comprising the steps of:

a. depositing sequentially over the semiconductor surface a thin gate oxide layer, a polysilicon layer, a refractory metal silicide layer, and a top layer oxide;

b. patterning a gate structure over an N-channel area;

c. implanting ions in a source and drain area adjacent the N-channel gate structure;

d. patterning a barrier spacer on opposite sides of the N-channel gate structure;

e. growing a field oxide adjacent the N-channel gate structure over the substrate wherein the field oxide is bounded by the barrier spacer;

f. etching to selectively remove the barrier spacer thereby exposing the source and drain areas;

g. depositing a photoresist layer over the N-channel and P-channel devices;

h. patterning a P-channel gate structure while protecting the N-channel device with the photoresist layer;

i. ion implanting a low-dose P-channel source and drain area;

j. forming an oxide spacer on opposite sides of the N-channel and P-channel gate structures;

k. depositing a titanium nitride layer over the N-channel and P-channel devices;

l. depositing a polysilicon layer over the N-channel and P-channel devices;

m. in situ doping the polysilicon layer to create a conducting polysilicon layer;

n. selectively etching the conducting polysilicon layer over the N-channel and P-channel devices to form an opening over the N-channel and P-channel gate structures and a boundary over the field oxide layer of the N-channel and P-channel devices;

o. selectively etching the titanium nitride layer to form openings over the N-channel and P-channel gate structures and a boundary over the field oxide layers thereby forming a raised source/drain electrical connection at the N-channel and P-channel devices;

p. depositing an oxide isolation layer over the MOSFET device;

q. patterning a plurality of contact openings in the oxide isolation layer over the conducting polysilicon of the N-channel and P-channel devices;

r. depositing a thin titanium nitride layer within the contact openings;

s. depositing and patterning a tungsten conductor within the plurality contact openings; and then t. depositing and patterning a plurality of bit line metal conductors over the metal conductor in the contact opening thereby providing a low-resistance electrical connection from the bit line through the raised source/drain electrical connection to the source and drain areas of both N-channel and P-channel devices.

7. The integrated process for fabrication as recited in claim 6 wherein the polysilicon layers are in situ doped by phosphorus or arsenic.

8. The integrated process for fabrication as recited in claim 7 wherein the P-channel source and drain areas are doped by a phosphorous halo implant and a boron implant.

9. The integrated process for fabrication as recited in claim 8 wherein the N-channel source and drain are doped by a boron and phosphorous implant.

* * * * *